United States Patent
Craig et al.

(10) Patent No.: US 6,268,735 B1
(45) Date of Patent: Jul. 31, 2001

(54) NOISE SOURCE MODULE FOR MICROWAVE TEST SYSTEMS

(75) Inventors: Thomas Michael Craig, Westford; Matthew Thomas Begg, Waltham, both of MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/326,449

(22) Filed: Jun. 4, 1999

(51) Int. Cl.[7] .......................... G01R 35/00; G01R 27/02
(52) U.S. Cl. ..................... 324/603; 324/601; 324/613; 324/614
(58) Field of Search .................................... 324/603, 613, 324/601, 614

(56) References Cited

U.S. PATENT DOCUMENTS

| | | | |
|---|---|---|---|
| 4,905,308 | * 2/1990 | Davidson | 455/226 |
| 5,191,294 | * 3/1993 | Grace et al. | 324/613 |
| 5,416,422 | * 5/1995 | Dildine | 324/614 |
| 6,066,953 | * 5/2000 | Wadell | 324/601 |

* cited by examiner

Primary Examiner—Glenn W. Brown
Assistant Examiner—Wasseem H. Hamdan
(74) Attorney, Agent, or Firm—Teradyne Legal Dept.

(57) ABSTRACT

A module for use in automatic test equipment is disclosed. The module is especially useful for measuring noise parameters of high frequency devices. The module includes a noise generator and a plurality of EEPROM's that store reflection coefficients and ENR data for the noise generator. Computerized control circuitry in the automatic test equipment uses the stored data to reduce impedance mismatch and Excess Noise Ratio (ENR) data uncertainties in the measured noise parameters.

9 Claims, 6 Drawing Sheets

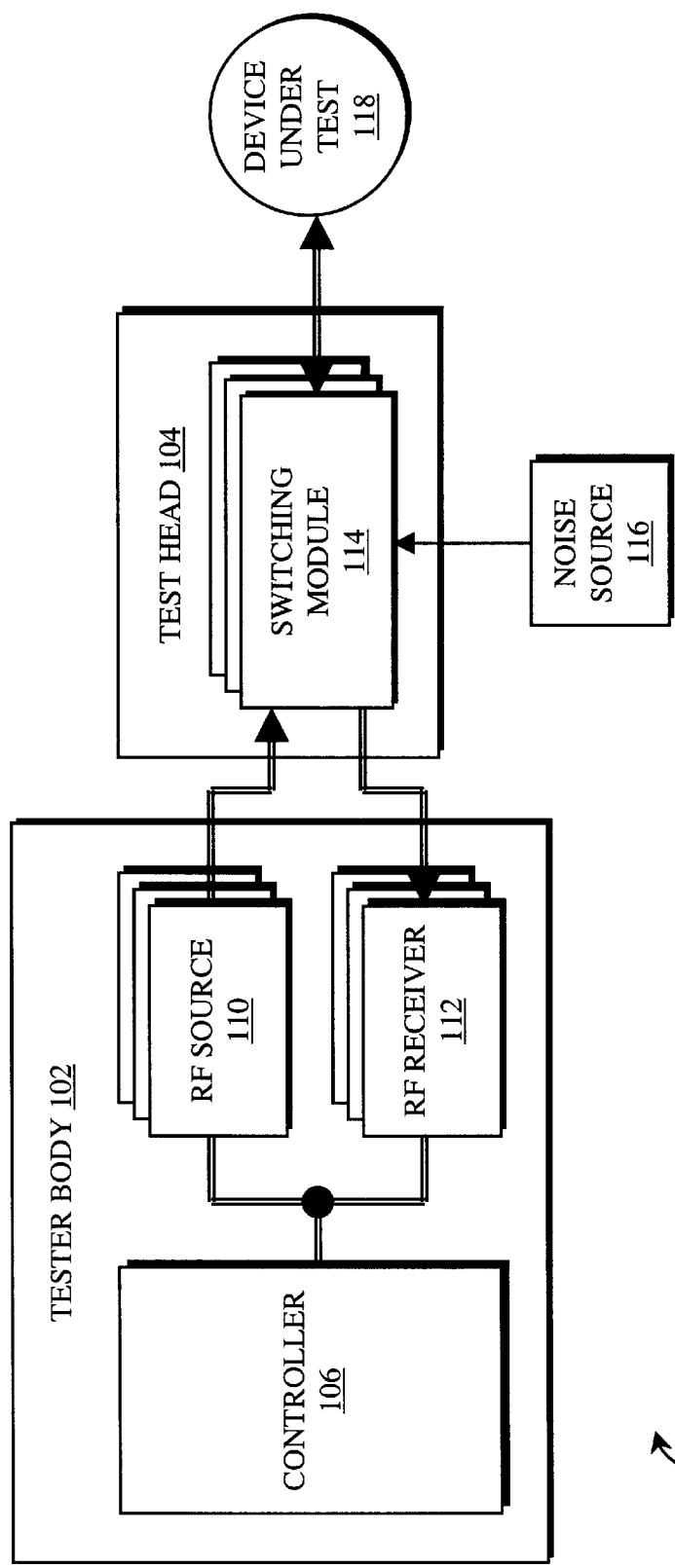
FIG. 1A - PRIOR ART

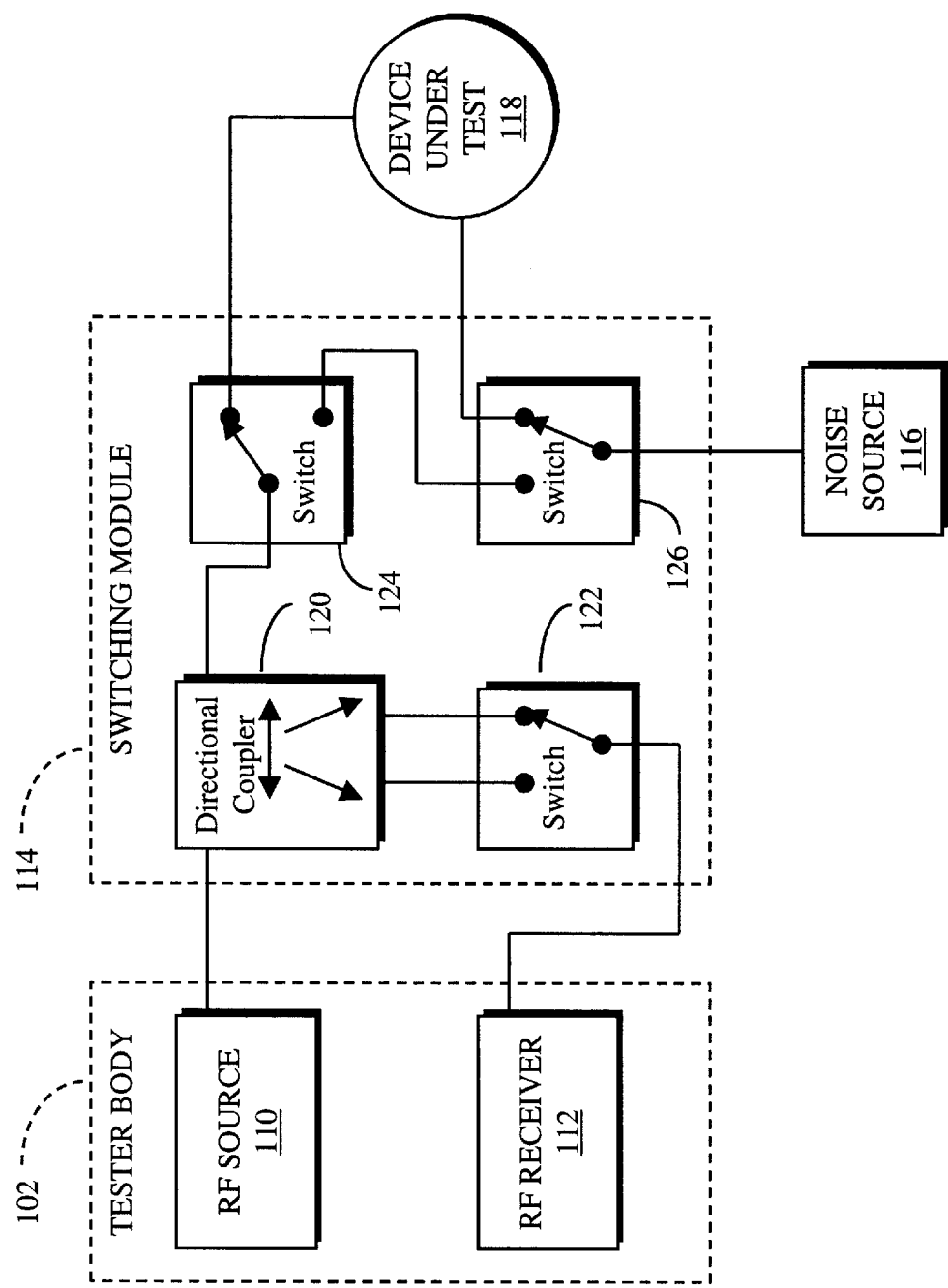
FIG. 1B - PRIOR ART

NOISE SOURCE MODULE FOR MICROWAVE TEST SYSTEMS

This invention relates generally to automatic test equipment, and more specifically to automatic test equipment for testing and characterizing RF/microwave devices.

Automatic test equipment, commonly known as a "tester," has traditionally been used in processes for manufacturing semiconductor devices to determine whether the manufactured devices contain defects. In this way, large volumes of devices can be tested quickly, thereby reducing both time-to-market and production costs.

More recently, testers have been used for both testing and characterizing high frequency semiconductor devices, which are designed to operate in the radio frequency (RF) and microwave ranges. Such "wireless" devices include those used in the cellular telephone industry, where high volume, low cost production is especially important.

One characteristic that is frequently measured relates to noise parameters of RF/microwave devices. For example, testers have been used to measure the noise factor of RF/microwave devices, which when expressed in decibels (dB) is commonly referred to as the noise figure of a device.

FIG. 1A shows a partial block diagram of a conventional tester 100 used to measure the noise figure of a device under test (DUT) 118, which is designed to operate in the RF or microwave band. The tester 100 has a tester body 102, which includes a computerized controller 106 that can be programmed by a tester operator to perform various test and analysis operations. For example, the controller 106 may be programmed to control RF signal sources (e.g., an RF source 110) and receivers (e.g., an RF receiver 112). The RF source 110 and the RF receiver 112 generate and detect, respectively, test signals for the DUT 118.

The tester 100 also includes a test head 104, which generally routes the test signals between the tester body 102 and the DUT 118. Accordingly, the test head 104 includes switching modules (e.g., a switching module 114) for directing the test signals between the RF source 110, the RF receiver 112, and the DUT 118.

In a typical test configuration, an external noise source 116 is coupled to the test head 104 and used for measuring the noise figure of the DUT 118. Thus, the switching module 114 also routes signals between the noise source 116 and the DUT 118. Further, the noise source 116 is typically attached to a device interface board (not shown), which also includes hardware for interfacing the test head 104 with the DUT 118.

FIG. 1B shows a simplified schematic diagram of the switching module 114, which routes signals between the RF source 110, the RF receiver 112, the noise source 116, and the DUT 118. The switching module 114 includes a directional coupler 120 with one port connected to the RF source 110, two ports connected to the throws of a switch 122, and one port connected to the pole of a switch 124.

Further, the pole of the switch 122 is coupled to the RF receiver 112. The switch 122 can therefore be actuated for allowing the RF receiver 112 to detect signals on either the "source side" or the "DUT side" of the directional coupler 120.

The throws of the switch 124 are connected to the DUT 118 and a throw of a switch 126. The switch 124 can therefore be actuated to pass test signals from the RF source 110 to the DUT 118.

The other throw of the switch 126 is also connected to the DUT 118. Further, the pole of the switch 126 is coupled to the noise source 116. The switch 126 can therefore be actuated to pass signals from the noise source 116 to the DUT 118. In addition, switches 122, 124, and 126 can be actuated to pass signals from the noise source 116 to the RF receiver 112.

Although the noise source 116 is primarily meant to be used for measuring the noise figure of the DUT 118, it is well understood that noise is inherent in all electronic circuitry, including the circuitry used to implement the measurement system. It is therefore generally necessary to take into account the noise contributed by the measurement system when measuring the noise figure of the DUT 118.

The noise figure of the DUT 118, $F_{DUT}$, can be calculated using the formula $$F_{DUT} = 10 \text{ Log } [F_{SYS} - (F_{RCVR}-1)/G_{DUT}], \quad \text{(eq. 1)}$$

where $F_{SYS}$ is the noise figure of the measurement system, $F_{RCVR}$ is the noise figure of the RF receiver 112, and $G_{DUT}$ is the gain of the DUT 118. The noise contributed by the measurement system is therefore included and accounted for in the calculation of $F_{DUT}$ using eq. 1.

The noise figure of any two-port electronic device can generally be determined using the formula $$F = 10 \text{ Log } \{ENR - [(N_1/N_2) - 1]\}, \quad \text{(eq. 2)}$$

where ENR is the "excess noise ratio" of the noise source, and $N_1$ and $N_2$ are the noise power from the two-port device when the noise source is biased "on" and "off", respectively.

In particular, ENR values for the noise source 116 can be determined experimentally. More likely, these ENR values are measured by the manufacturer of the noise source 116 and provided to the tester operator as documentation. Further, the ENR values for the noise source 116 are typically specified as a function of frequency.

Eq. 2 can therefore be used to determine values for $F_{SYS}$ and $F_{RCVR}$ in eq. 1. When $F_{SYS}$ is determined, the switch 126 is actuated to couple the noise source 116 to an input port of the DUT 118, and the switches 122 and 124 are actuated to couple an output port of the DUT 118 to the RF receiver 112. However, when $F_{RCVR}$ is determined, the switches 124 and 126 are actuated to by-pass the DUT 118.

The gain of the DUT 118, $G_{DUT}$, can be calculated using the formula $$G_{DUT} = (N_1 - N_2)/k(T_1 - T_2) B, \quad \text{(eq. 3)}$$

where $T_1$ and $T_2$ are the noise temperatures supplied by the noise source 116 when the noise source 116 is biased "on" and "off", respectively; k is the Boltzmann's constant; and, B is the bandwidth of the DUT 118. The product, k $(T_1-T_2)$ B, is commonly called the "excess noise power" from the noise source. The noise figure of the DUT 118 can therefore be calculated after incorporating suitable values for $F_{SYS}$, $F_{RCVR}$, and $G_{DUT}$ into eq. 1.

We have recognized that measuring noise parameters of a device under test in the manner described above may result in measurement uncertainties, which can adversely affect the accuracy of noise figure measurements. Highly accurate noise figure measurements are important to RF/microwave device manufacturers because it allows them to provide better noise specifications for their devices. Further, RF/microwave device customers are generally willing to pay more for devices with the best noise specifications. It is therefore important that noise parameters of a device under test be made as accurately as possible.

One type of measurement uncertainty is caused by impedance mismatches, including mismatches between the noise source and the device under test, the noise source and the RF receiver, and the device under test and the RF receiver. Such impedance mismatches can cause signal reflections that affect the amount of power provided to the elements of the measurement system. Further, these impedance mismatches tend to be more prevalent in measurement systems operating in high frequency ranges.

For example, impedance mismatches between the noise source 116 and the input port of the DUT 118 can affect the noise power provided to the DUT 118, thereby adding uncertainty to the determination of $F_{SYS}$. Impedance mismatches between the output port of the DUT 118 and the RF receiver 112 can also add uncertainty to $F_{SYS}$ by affecting the power provided to the RF receiver 112. Similarly, impedance mismatches between the noise source 116 and the RF receiver 112 can affect the noise power provided to the RF receiver 112, thereby adding uncertainty to the determination of $F_{RCVR}$. These uncertainties generally lead to inaccurate noise figure measurements for a device under test.

Further, different testers can yield different levels of impedance mismatch. This means that noise parameter measurements made on the same device might vary from tester-to-tester. In addition, testers such as the tester 100 are meant to test and characterize devices in volume quantities. However, different levels of impedance mismatch might result with each device tested. This means that noise parameter measurements made by the same tester might vary from device-to-device. These tester-to-tester and device-to-device variations can lead to inconsistent noise parameter measurements, which are undesirable in mass production environments.

Another type of measurement uncertainty is caused by uncertainties in the values of ENR used in eq. 2. As mentioned above, the ENR values for the noise source 116 are typically specified as a function of frequency. This means that a limited number of discrete ENR values are determined or provided across a bandwidth. For example, the manufacturer of the noise source 116 typically provides a limited number of ENR values across a bandwidth as documentation for the noise source.

However, it is frequently necessary to interpolate between these ENR values when calculating noise figure using eq. 2. This results in uncertainty in the ENR values, which also leads to inaccuracies in the noise figure calculations for $F_{SYS}$, $F_{RCVR}$, and ultimately $F_{DUT}$.

We have also recognized that it can be both cumbersome and costly to incorporate an external noise source into a tester. For example, in order to make accurate noise parameter measurements, it is important that the noise source be situated as close as possible to the device under test. This is why the noise source 116 is attached to the device interface board (not shown) in the tester 100.

However, a different device interface board is generally needed to test each type of device. A different noise source must therefore be attached to each device interface board for each type of device tested. This generally adds to the cost of a tester.

It would therefore be desirable to have a tester that can measure noise parameters of RF/microwave devices with less measurement uncertainty than conventional testers. Such a tester would be able to account for impedance mismatches throughout the measurement system, and minimize uncertainty in ENR across a bandwidth of interest. This would lead to more accurate noise parameter measurements. It would also be desirable to have a tester for RF/microwave devices that is easier and less costly to manufacture.

SUMMARY OF THE INVENTION

With the foregoing background in mind, it is an object of the invention to provide a tester for testing and characterizing RF/microwave devices.

Another object of the invention is to provide a tester that measures noise parameters of RF/microwave devices with increased accuracy.

Still another object of the invention is to provide an easy way to account for tester-to-tester and device-to-device variations while performing noise parameter measurements.

Yet another object of the invention is to provide a tester for testing and characterizing RF/microwave devices that is easier and less costly to manufacture.

The foregoing and other objects are achieved in a tester having an integrated noise source module with a noise generator and a plurality of programmable storage devices. The storage devices are programmed with data relating to impedance mismatches and pluralities of ENR values for the noise generator.

In a preferred embodiment, the noise source module is plugged into a tester, thereby switchably connecting the module to at least one of a plurality of measurement channels.

According to one feature, the storage devices are programmed with reflection coefficients of the noise generator for both the "biased-on" and "biased-off" conditions.

According to another feature, the plurality of programmable storage devices is implemented using a plurality of EEPROM's.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1A is a partial block diagram of a conventional tester;

FIG. 1B is the FIG. 1A apparatus including a simplified schematic diagram of a switching module;

DESCRIPTION OF THE PREFERRED EMBODIMENT

Figure 2A:
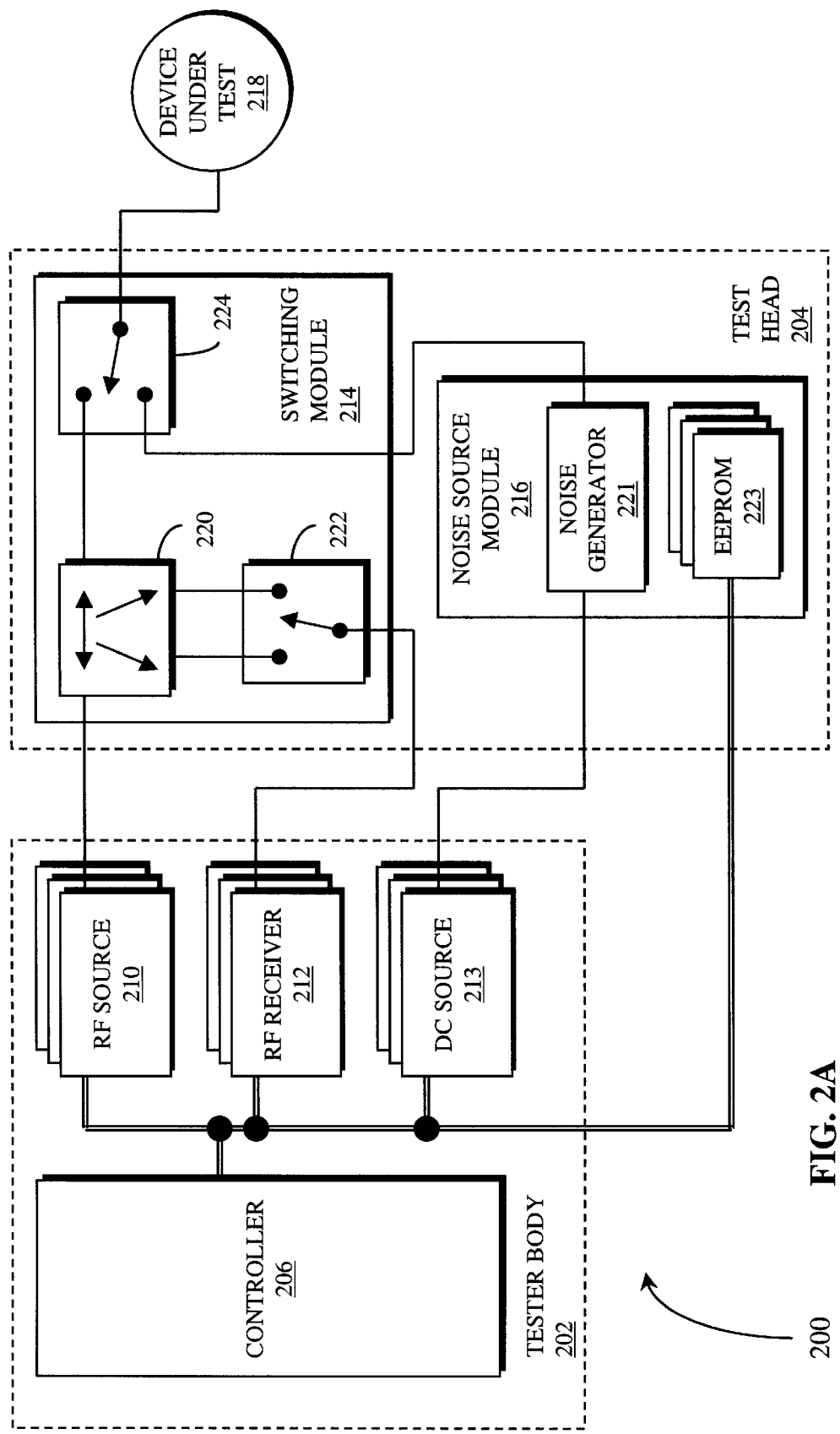
FIG. 2A is a block diagram of a tester incorporating a noise source module in accordance with the present invention.

FIG. 2A shows a block diagram of a tester 200 in accordance with the present invention. The tester 200 includes a tester body 202, which incorporates programmable controller circuitry 206. Further, the tester 200 is primarily meant to be used for testing and characterizing high frequency semiconductor devices, such as those used in cellular telephone equipment. These devices are typically designed to operate in a frequency range of about 10 MHz to 6 GHz. For this reason, the tester body 202 also includes a plurality of RF/microwave signal sources (e.g., an RF source 210) and a plurality of RF/microwave signal receivers (e.g., an RF signal receiver 212).

A tester operator can program the controller 206 to perform various operations for testing, analyzing, and characterizing high frequency devices. For example, the tester operator may program the controller 206 for directing the RF source 210 to provide RF test signals for a device under test, and for directing the RF receiver 212 to detect RF signals produced by the device under test in response to the test signals.

Because high frequency devices under test often include lower frequency analog circuitry and digital circuitry, the tester body 202 also includes circuitry (not shown) for generating and detecting low frequency AC signals, and digital signals. Further, the tester body 202 also includes circuitry for generating DC levels (e.g., a DC source 213).

It should be understood that the tester body 202 is meant to incorporate elements that are well known in the art and may be found in conventional testers. The exact implementation of these elements and their configuration in the tester body 202 is therefore not critical to the invention.

The tester 200 also includes a test head 204 incorporating at least one switching module 214. Additional details about the general structure and operation of the switching module 214 can be obtained by referring to U.S. Pat. No. 5,572,160, assigned to TERADYNE®, Inc., Boston, Mass., USA, which is incorporated herein by reference. For example, the switching module 214 includes a plurality of directional elements, such as a directional coupler 220, and a plurality of switches, such as switches 222 and 224. The switching module 214 also includes circuitry (not shown) for controlling the operation of the directional elements and the switches. The programmable controller 206 generally directs the operation of this circuitry.

In particular, the directional coupler 220 is a four-port device. As shown in FIG. 2A, one port of the directional coupler 220 is connected to the RE source 210 and another port is connected to a throw of the switch 224, which may be actuated to connect the directional coupler 220 to a device under test (DUT) 218. Accordingly, one port may be regarded as being on the "source-side" of the directional coupler 220, while another port may be regarded as being on the "DUT-side" of the directional coupler 220. The RF source 210 can therefore produce an RF/microwave test signal that passes from the source-side to the DUT-side of the directional coupler 220, through the switch 224, to an electrical node of the DUT 218.

The directional coupler 220 also has two ports that are coupled to the throws of the switch 222. These ports are commonly referred to as the "forward" and "reverse" ports of the directional coupler 220. In particular, the forward port can be viewed as being coupled to a signal provided to the port on the source side of the coupler 220. Similarly, the reverse port can be viewed as being coupled to a signal provided to the port on the DUT side of the coupler 220. The switch 222 can therefore be actuated to connect the RF receiver 212 to either the forward or the reverse port of the directional coupler 220.

The switching module 214 shown in FIG. 2A is a simplified version of a switching module used in the tester 200. Practical switching modules generally include a plurality of paths or channels to a device under test. For example, FIG. 2C shows a more detailed block diagram of the switching module 214, which now includes two channels 238 and 239 to the DUT 218. The channels 238 and 239 may be used for applying and measuring respective signals at leads of the DUT 218. Alternatively, signals on the channels 238 and 239 may be combined using the intermodulation (IM) path interconnecting directional elements 245 and 259 and switches 246 and 260.

As mentioned above, the tester 200 is primarily meant to be used for testing and characterizing RF/microwave devices. Such devices are generally used in low-noise systems. It is therefore important to be able to measure the noise parameters of these devices as accurately as possible. One noise parameter that is frequently used to characterize RF/microwave devices is the noise figure of a device. Other noise parameters include the Y-factor and signal-to-noise ratio (SNR). The noise figure of a device can generally be determined by connecting a noise source to the device and then measuring the input and output noise levels of the device.

For this reason, the test head 204 also incorporates a noise source module 216, which includes a noise generator 221 and a plurality of programmable memory devices (e.g., device 223). In the preferred embodiment, the memory device 223 is implemented using an EEPROM, such as the X24645 EEPROM manufactured by XICOR®, Inc., Milpitas, Calif., USA.

Figure 2B:
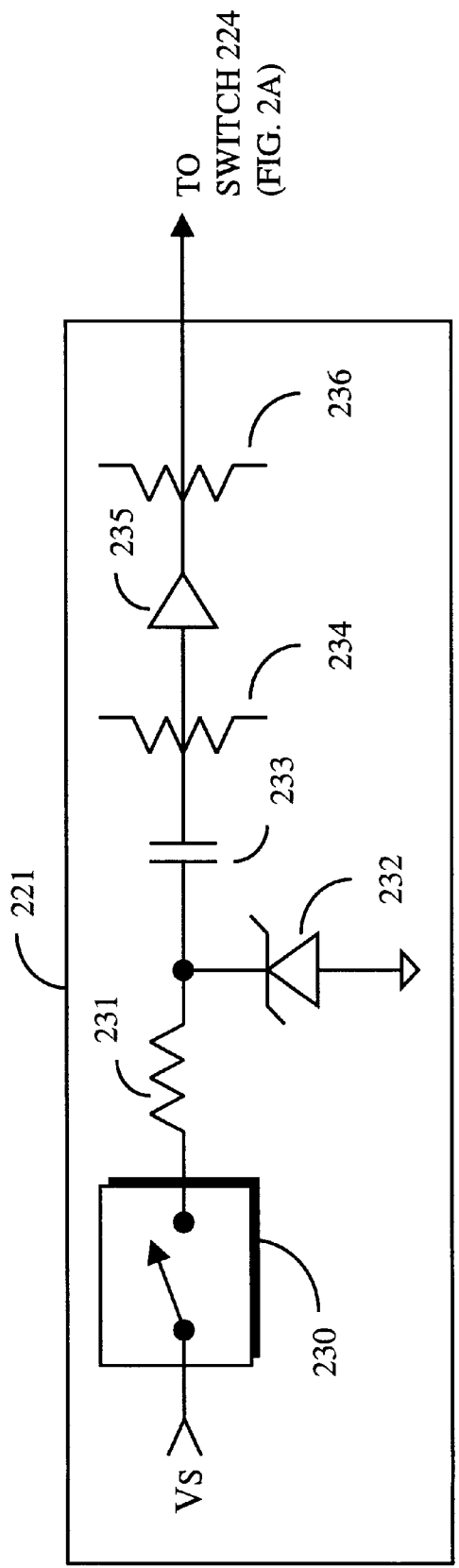
FIG. 2B is a schematic diagram of a noise generator included in the noise source module shown in FIG. 2A.
Figure 2C:
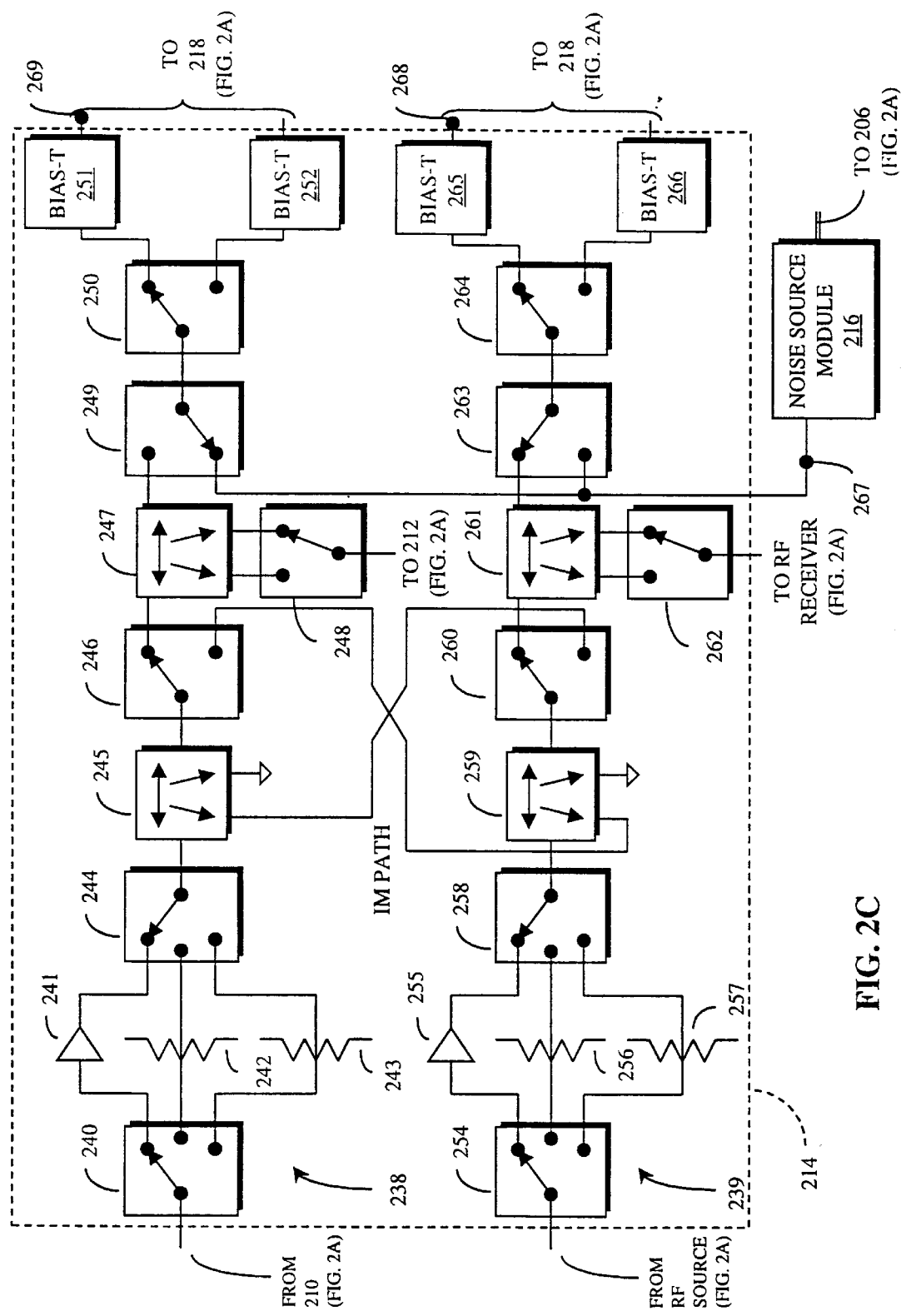
FIG. 2C is a schematic diagram of a switching module coupled to the noise source module of the FIG. 2A apparatus.

Further, the noise generator 221 is preferably implemented as shown in the schematic diagram of FIG. 2B. In particular, a switch 230 switchably applies a DC voltage level, $V_S$, thereby operating a noise diode 232 in its avalanche breakdown region to produce a noise signal. This is known as biasing the noise generator 221 "on" and "off." The DC level, $V_S$, is supplied by the DC source 213 in the tester body 202.

In addition, a resistor 231 and a capacitor 233 on opposite sides of the noise diode 232 isolate the DC level, $V_S$, from the noise signal output. Further, low-noise amplifier (LNA) 235 and attenuation pads 234 and 236 adjust the level of the noise signal output.

The output of the noise generator 221 is connected to the other throw of the switch 224, which may be actuated to connect the noise generator 221 to the DUT 218. The noise generator 221 can therefore produce a noise signal that passes through the switch 224 to an electrical node of the DUT 218.

In the preferred embodiment, the noise generator 221 and the EEPROM's (e.g., EEPROM 223) are situated on the same assembly and collectively constitute the noise source module 216. Further, suitable connectors (not shown) are used to facilitate the transmission of data from the EEPROM's to the controller 206, and the transmission of noise signals from the noise generator 221 to the switching module 214. Accordingly, the noise source module 216 is preferably plugged into the tester 200, thereby making the noise source module 216 easily connectable and interchangeable.

As mentioned above, the noise figure value is often used to characterize the performance of an RF/microwave device. A simplified process for measuring the noise figure of a device under test includes the steps of applying noise signals to the device under test and then measuring the resulting output noise power. Accordingly, the DC source 213, the noise generator 221, and the switch 224 can be operated under the control of the controller 206 for applying noise signals to the DUT 218. Further, the switch 224, the directional coupler 220, the switch 222, and the RF receiver 212 can be similarly controlled for measuring the resulting DUT outputs.

However, in a practical measurement configuration, the input and output impedances of various elements of the measurement system are not perfectly matched. Consequently, signal reflections can occur along the transmission paths between the system elements. This means that noise signals applied to a device under test by a noise source may be partially reflected by the device under test, thereby affecting the amount of noise power provided to the device under test and causing uncertainties in noise figure measurements. These uncertainties are commonly called "mismatch" uncertainties.

For example, the output impedance of the noise source module 216 is generally not matched to the input impedance of the DUT 218. As a result, when the noise generator 221 produces a noise signal and the switching module 214 is configured so that the noise signal is applied to the DUT 218, a portion of an incident noise signal will generally be reflected back toward the test head 204.

Because there may also be impedance mismatch between the DUT 218 and the switching module 214, a portion of the reflected noise signal is generally reflected from the switching module circuitry back to the DUT 218. This phenomenon may be referred to as the first order effects of the reflected noise signal.

Further, because the switching module 214 is configured so that the noise signal passes from the noise source module 216 to the DUT 218, a remaining portion of the reflected noise signal is generally passed through the switching module 214 to the noise generator 221. The impedance mismatch at the noise generator 221 will then cause another portion of the reflected noise signal to be reflected from the noise generator 221 back toward the DUT 218. This phenomenon may be referred to as the second order effects of the reflected noise signal.

A novel way of compensating for the effects of reflected signals in microwave test systems is described in U.S. patent application Ser. No. 08/955,782, assigned to TERADYNE®, Inc., which is incorporated herein by reference. That application describes a calibration procedure that includes the step of determining the "s-parameters" (i.e., $S_{11}$, $S_{12}$, $S_{21}$, and $S_{22}$) of switching module circuitry. These s-parameters can be viewed as forming a mathematical model of the switching module circuitry. For example, a vector network analyzer (VNA) and known calibration techniques may be used to determine s-parameters for the switching module 214.

The VNA may also be used to measure the reflection coefficients, $\Gamma_{N1}$, and $\Gamma_{N2}$, of the noise source module 216. $\Gamma_{N1}$ and $\Gamma_{N2}$ are the reflection coefficients of the noise source module 216 when the noise generator 221 is biased "on" and "off", respectively, using the switch 230. Further, the VNA may be used to measure reflection coefficients, $\Gamma_{DUT,IN}$ and $\Gamma_{DUT,OUT}$, relating to input and output ports, respectively, of the DUT 218.

Once the s-parameters of the switching module 214 and the reflection coefficients of the noise source module 216 and the DUT 218 are known, the first and second order effects of the reflected noise signal can be calculated and used to make appropriate corrections when determining the noise power provided to the DUT 218.

An important advantage of the present invention is that the reflection coefficients, $\Gamma_{N1}$ and $\Gamma_{N2}$, for the noise source module 216 are preferably measured and stored in the EEPROM's before the noise source module 216 is plugged into the tester 200. This simplifies the calibration of the tester 200 for noise parameter measurements because the reflection coefficients, $\Gamma_{N1}$ and $\Gamma_{N2}$, stay with the noise source module 216. Accordingly, when a noise source module is added to a tester, or when a noise source module in a tester is interchanged with a different noise source module, it is not necessary to measure the reflection coefficients $\Gamma_{N1}$ and $\Gamma_{N2}$ before using the tester to perform noise parameter measurements. This is because the reflection coefficients $\Gamma_{N1}$ and $\Gamma_{N2}$ are easily accessed from the EEPROM's included with the noise source module.

As mentioned above, the calculation of noise figure values generally includes the "excess noise ratio" (ENR) of a noise generator. ENR is generally defined as the amount of noise power above the noise floor. Further, ENR values for a noise generator are typically provided by the noise generator manufacturer and are typically specified as a function of frequency. Because noise generators are generally designed to cover a particular bandwidth, the noise generator manufacturer typically provides ENR values at a plurality of frequencies across the bandwidth.

However, when calculating noise figure values, it is sometimes necessary to use ENR values that are not provided by the manufacturer. These ENR values typically correspond with frequencies that fall between the frequencies for the ENR values provided. This means that it is sometimes necessary to interpolate between the ENR values, thereby causing additional uncertainties in noise figure measurements. These uncertainties are commonly called "ENR uncertainties."

For this reason, the EEPROM's included in the noise source module 216 are also used for storing ENR values for the noise generator 221. These stored ENR values are used with the stored $\Gamma_{N1}$ and $\Gamma_{N2}$ coefficients for obtaining more accurate noise parameter measurements.

Noise generator manufacturers have traditionally provided a limited number of ENR values across a particular bandwidth of interest; for example, twenty-eight (28) ENR values. However, the EEPROM's included with the noise source module 216 preferably store at least 600 ENR values covering the bandwidth for the noise generator 221. These ENR values can be determined using known techniques. Because the stored number of ENR values is substantially greater than that which is normally provided, ENR uncertainties in noise figure calculations are substantially decreased using the noise source module 216.

The ENR values and the reflection coefficients, $\Gamma_{N1}$ and $\Gamma_{N2}$, might be stored in respective EEPROM's in the noise source module 216. However, it should be understood that the exact configuration for storing the ENR values and the $\Gamma_{N1}$ and $\Gamma_{N2}$ coefficients is not critical to the invention.

Figure 3:
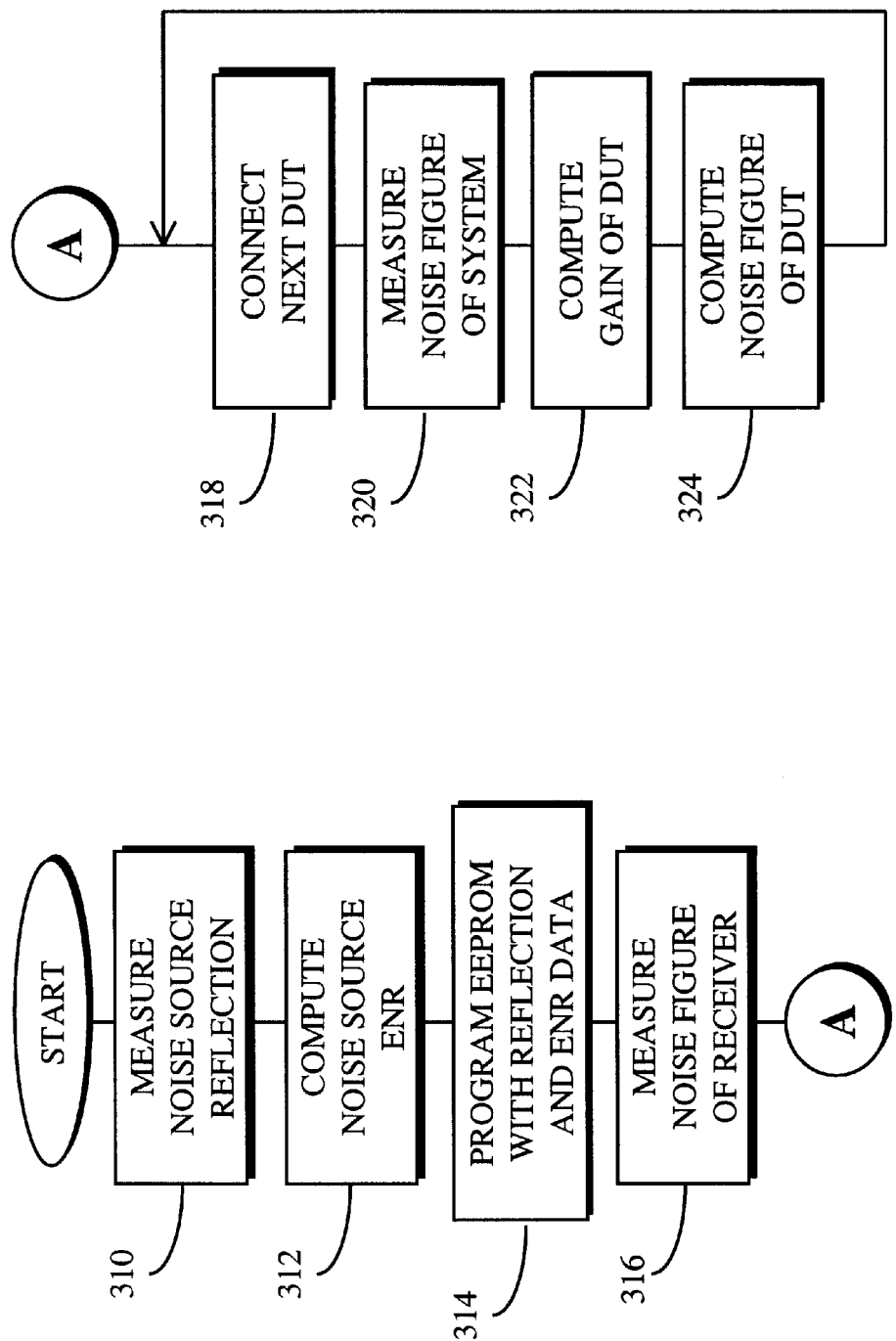
FIG. 3 is a flowchart diagram of a method for measuring noise parameters using the FIG. 2A apparatus.

A method of determining noise parameters, such as the noise figure, of an RF/microwave device under test is preferably implemented in accordance with the procedure shown in FIG. 3. This procedure is performed under control of software that is programmed into the controller 206 included in the tester body 202.

First, mismatch data relating to reflections at the noise source module 216 is measured in block 310. This mismatch data includes the reflection coefficients $\Gamma_{N1}$ and $\Gamma_{N2}$. In the preferred embodiment, the reflection coefficients, $\Gamma_{N1}$ and $\Gamma_{N2}$, are measured using a VNA connected to the noise source module 216, which is unplugged from the tester 200. Accordingly, the VNA measures the reflection coefficients, $\Gamma_{N1}$ and $\Gamma_{N2}$, looking into a port 267 (FIG. 2C) of the noise source module 216. Further, because the noise generator 221 is designed to cover a bandwidth, $\Gamma_{N1}$ and $\Gamma_{N2}$ are preferably determined at various frequencies across the bandwidth.

Next, ENR values looking into the port 267 (FIG. 2C) are computed in block 312. As mentioned above, at least 600 ENR values are preferably computed, with each ENR value corresponding to a different frequency across the bandwidth of the noise generator 221. Further, the reflection coefficients, $\Gamma_{N1}$ and $\Gamma_{N2}$, are preferably computed in block 310 at these same 600 frequency points.

After the desired number of reflection coefficients and ENR values are determined in blocks 310 and 312, respectively, the reflection coefficients and the ENR values are programmed into EEPROM's in block 314. For example, one EEPROM in the noise source module 216 might be programmed for storing the ENR values and their corresponding frequencies, and the remaining EEPROM's might be programmed for storing the reflection coefficients and their corresponding frequencies. Alternatively, reflection coefficients and ENR values corresponding to the same frequency points might be programmed into the EEPROM's in adjacent memory locations.

A noise source module in accordance with the present invention therefore includes a noise generator and EEPROM's programmed with reflection coefficient and ENR data directly relating to the noise generator. The noise source module may then be plugged into a tester, which uses the data stored in the EEPROM's to reduce mismatch and ENR uncertainties and therefore increase noise measurement accuracy.

For example, the data stored in the EEPROM's is used to compute the reflection coefficients, $\Gamma_{N1}$, CORRECTED and $\Gamma_{N2}$, CORRECTED, looking into a port, such as a port 268 (FIG. 2C), of the switching module 214. The corrected mismatch data for the port 268 may be computed using the formulae $$\Gamma_{N1,\ CORRECTED} = S_{22} + (S_{21}S_{12}\Gamma_{N1})/(1-\Gamma_{N1}S_{11}), \quad (eq.\ 4)$$

$$\Gamma_{N2,\ CORRECTED} = S_{22} + (S_{21}S_{12}\Gamma_{N2})/(1-\Gamma_{N2}S_{11}). \quad (eq.\ 5)$$

Accordingly, the s-parameters $S_{11}$, $S_{12}$, $S_{21}$, and $S_{22}$ of the switching module 214 looking into the port 268 are also measured. The s-parameters are preferably measured using a VNA connected externally to the tester 200. For example, the VNA may be connected to a tester pin on a device interface board (not shown), which serves as an interface between the test head 204 and the DUT 218. This tester pin may in turn be connected to the port 268 (FIG. 2C) of the switching module 214. Further, the s-parameters are preferably measured at the same frequency points as the reflection coefficients and ENR values determined in blocks 310 and 312.

The data stored in the EEPROM's and the s-parameters of the switching module 214 are also used to compute corrected ENR values. The corrected ENR values looking into the port 268, which is coupled to an input port of the DUT 218, may be computed using the formula $$ENR_{CORRECTED} = ENR|S_{21}|^2/|1-S_{11}\Gamma_{N1}|^2|1-\Gamma_{N1,\ CORRECTED}\Gamma_T|^2 \quad (eq.\ 6)$$

The corrected mismatch and ENR data may then be stored in a memory (not shown) included in the controller 206. Both the manner and means of storing the corrected mismatch data are also not critical to the invention.

As mentioned above, noise contributed by the measurement system must be taken into account when making noise figure measurements using the noise source module 216. For this reason, the noise figure of the RF receiver (e.g., the RF receiver 212) included in the tester body 202 is measured in block 316.

The noise figure of the RF receiver 212, $F_{RCVR}$, may be measured using known techniques. For example, switches 263 and 264 in the switching module 214 (FIG. 2C) may be actuated to pass noise signals from the noise source module 216 to a bias-T network 265 that is connected directly to a bias-T network 251, thereby by-passing the DUT 218. Switches 248, 249, and 250 may also be actuated to pass the noise signals at the bias-T network 251 to the RF receiver 212.

Because there is generally mismatch between the noise source module 216 and the RF receiver 212, signal reflections at the RF receiver 212 may affect the amount of noise power provided to the RF receiver 212, thereby causing an inaccurate measurement of $F_{RCVR}$. For this reason, a reflection coefficient, $\Gamma_{RCVR}$, is measured using a VNA; s-parameters are measured using a VNA looking into the port 269; and, a corrected reflection coefficient, $\Gamma_{RCVR,\ CORRECTED}$, is computed as $$\Gamma_{RCVR,\ CORRECTED} = S'_{22} + (S'_{21}S'_{12}\Gamma_{RCVR})/(1-\Gamma_{RCVR}S'_{11}), \quad (eq.\ 7)$$

where $S'_{11}$, $S'_{12}$, $S'_{21}$, and $S'_{22}$ are the s-parameters of the switching module 214 looking into the port 269.

Further, $ENR_{CORRECTED}$ values looking into the port 268, which is now coupled to the port 269, are computed as $$ENR_{CORRECTED} = ENR|S_{21}|^2/|1-S_{11}\Gamma_{N1}|^2|1-\Gamma_{N1,\ CORRECTED}\Gamma_{RCVR,\ CORRECTED}|^2. \quad (eq.\ 8)$$

The noise figure, $F_{RCVR}$, may then be computed using eq. 2. Further, suitable mismatch and ENR data (e.g., $\Gamma_{N1,\ CORRECTED}$, $\Gamma_{N2,\ CORRECED}$, $\Gamma_{RCVR,\ CORRECTED}$, and $ENR_{CORRECTED}$) may be used to make corrections for the noise power (i.e., $N_1$ and $N_2$) provided to the RF receiver 212. This reduces measurement uncertainty cause by the impedance mismatch between the noise source module 216 and the RF receiver 212.

The noise power corrections are preferably made computationally using techniques that are known to those skilled in this art. Further, the noise power corrections may be made by the controller 206 when analyzing the noise detected by the RF receiver 212. It should be understood that the exact method used to make these corrections is not critical to the invention.

Blocks 310 through 316 of the procedure shown in FIG. 3 are primarily meant to be performed during an initial calibration of the measurement system. Blocks 310 through 316 are therefore performed relatively infrequently. However, blocks 318 through 324 are primarily meant to be performed repeatedly in a manufacturing process for quickly measuring noise parameters of volume quantities of RF/microwave devices.

In particular, an RF/microwave device under test, such as the DUT 218, is connected to the tester 200 in block 318. A device under test is generally connected to a tester through a device interface board. Further, connections between the device under test and the tester may be made in an automatic fashion using an automated chip handling apparatus. Alternatively, these connections might be made manually.

Next, the noise figure of the measurement system is measured in block 320 using known techniques. Accordingly, the switches 263 and 264 in the switching module 214 may be actuated to pass noise signals from the noise source module 216 to the bias-T network 265 (FIG. 2C), which is now connected to the input port of the DUT 218.

Further, an output port of the DUT 218 is connected to the bias-T network 251 (FIG. 2C). The switches 248, 249, and 250 may then be actuated to pass noise signals at the bias-T network 251 to the RF receiver 212.

Eq. 2 may then be used to compute the noise figure, $F_{SYS}$, of the measurement system. Accordingly, suitable mismatch and ENR data (e.g., $\Gamma_{N1,\ CORRECTED}$, $\Gamma_{N2,\ CORRECTED}$, $\Gamma_{DUT,}$ $_{IN}$, and ENR$_{CORRECTED}$) may be used to make corrections for the noise power provided to the DUT 218. Similarly, suitable mismatch data (e.g., $\Gamma_{RCVR, CORRECTED}$, and $\Gamma_{DUT, OUT}$) may be used to make corrections for the noise power provided to the RF receiver 212 by the DUT 218. Again, these corrections are preferably made computationally by the controller 206 using techniques that are known to those skilled in this art.

The gain of the DUT 218, $G_{DUT}$, is then computed in block 322. Eq. 3 may be used to compute the gain, $G_{DUT}$. In addition, the controller 206 may access suitable mismatch and ENR data (e.g., $\Gamma_{N1, CORRECTED}$, $\Gamma_{N2, CORRECTED}$, $\Gamma_{DUT, IN}$, and ENR$_{CORRECTED}$) to make any necessary computational corrections to the noise power provided to the DUT 218, thereby reducing uncertainty in the computed gain, $G_{DUT}$.

Finally, the noise figure of the DUT 218, $F_{DUT}$, is computed in block 324. Accordingly, the values for $F_{RCVR}$, $F_{SYS}$, and $G_{DUT}$ computed in blocks 316, 320, and 322 may be incorporated into eq. 1 to compute the noise figure, $F_{DUT}$.

Having described one embodiment, numerous alternative embodiments or variations might be made. For example, it was described that the noise source module of the present invention is preferably incorporated into highly automated test equipment. However, this was merely an illustration. The noise source module might alternatively be used with less automated test systems.

Further, particular tester architecture was described including a tester body and a test head. However, this was also merely an illustration. The noise source module may be used with a tester of any architecture. The noise source module may also be used with measurement instruments that are designed for bench-top use.

In addition, it was described that the noise source module can be used for performing noise figure measurements on devices. However, this was merely an illustration. The noise source module can also be used to determine parameters such as noise factor, Y-factor, and signal-to-noise ratio.

In addition, it was described that EEPROM's are used for storing ENR and mismatch data in the noise source module. However, this was also merely an illustration. Any programmable non-volatile storage devices might alternatively be used.

In addition, FIG. 2B shows a schematic diagram of a particular implementation of the noise generator included with the noise source module. However, FIG. 2B is only meant to be illustrative. Any useful noise circuit might alternatively be used.

In addition, it was described that 600 ENR values are stored in the EEPROM's of the noise source module. However, this was merely an illustration. Fewer or more ENR values might alternatively be stored so long as the need for interpolating between ENR values does not result in an unacceptable level of ENR uncertainty.

Further, it was described that the 600 ENR values for the noise source module are computed using known techniques. However, this was also merely an illustration. The ENR values that are stored in the noise source module might include ENR values provided by the manufacturer and/or ENR values computed by the tester operator.

In addition, FIG. 3 shows a particular sequence of steps for performing noise figure measurements using the noise source module. However, this was also merely an illustration. The steps shown in FIG. 3 may be performed in any useful and convenient order so long as the noise source module is fully programmed before any noise measurements are made. Further, other useful formulae might be used when performing the steps for computing values for noise figure, ENR, and gain.

Therefore, the invention should be limited only by the spirit and scope of the appended claims.

What is claimed is:

1. A module for use in a tester, the tester including computerized control circuitry, pluralities of signal sources and receivers, and a plurality of channels for selectively connecting the sources, the receivers, and the module to electrical nodes of a device under test, the module comprising:

a noise generator coupled to at least one of the channels; and a non-volatile memory coupled to the noise generator for storing calibration data relating to electrical characteristics of the noise generator including mismatch data and Excess Noise Ratio (ENR) data for the noise generator, wherein the computerized control circuitry is coupled to the non-volatile memory for accessing the calibration data and applying the calibration data for making noise measurements of the device under test, and wherein the calibration data are stored in the module prior to installing the module in the tester, and the non-volatile memory preserves the calibration data even when the module is removed from the tester.

2. The module as recited in claim 1, wherein the test system has a tester body and a test head, and the module is incorporated into the test head.

3. The module as recited in claim 1, wherein the test system has a tester body and a test head, and the module is incorporated into the tester body.

4. A method for testing the noise of a device under test, comprising:

measuring characteristics of a noise source to ascertain calibration terms indicative of mismatch and ENR for the noise source;

storing the calibration terms of the noise source in a non-volatile memory provided with the noise source;

installing the noise source within a tester, the tester including computerized control circuitry, pluralities of signal sources and receivers, and a plurality of channels for selectively connecting the sources and receivers to electrical nodes of the device under test; and testing the device under test using the tester, including the computerized control circuitry accessing the calibration terms stored in the non-volatile memory and applying the calibration terms for determining measurement results.

5. A method as recited in claim 4, wherein the terms indicative of ENR of the noise source are indicative of a plurality of ENR values at a plurality of different frequencies.

6. A method as recited in claim 5, wherein the plurality of different frequencies corresponds to at least six hundred different frequencies.

7. A method as recited in claim 4, wherein the terms indicative of mismatch include a plurality of mismatch terms corresponding to mismatch at a plurality of different frequencies.

8. A method as recited in claim 4, wherein the terms indicative of mismatch include terms corresponding to both a biased-on and a biased-off condition of the noise source.

9. An automatic test system for testing noise of a device under test, comprising:

computerized control circuitry, a plurality of RF sources;

a plurality of RF receivers;

a plurality of channels for selectively connecting the plurality of sources and the plurality of receivers to electrical nodes of the device under test; and a noise source for generating noise signals for testing the device under test, the noise source including— a noise generator coupled to at least one of the channels, and a non-volatile memory, coupled to the noise generator, for storing calibration data relating to gain and mismatch characteristics of the noise generator, the calibration data being stored in the non-volatile memory prior to installing the noise source into the automatic test system, wherein the computerized control circuitry is coupled to the non-volatile memory for accessing the calibration data and applying the calibration data for obtaining accurate noise measurements wherein the non-volatile memory preserves the calibration data even when the noise source is removed from the tester.

* * * * *